United States Patent [19]
Dunham et al.

[11] Patent Number: 5,589,881
[45] Date of Patent: Dec. 31, 1996

[54] ENHANCED PERFORMANCE CCD OUTPUT AMPLIFIER

[75] Inventors: Mark E. Dunham, Los Alamos; David W. Morley, Santa Fe, both of N.M.

[73] Assignee: The Regents of the Univ. of California Office of Technology Transfer, Alameda, Calif.

[21] Appl. No.: 337,692

[22] Filed: Nov. 9, 1994

[51] Int. Cl.$^6$ ............................. H04N 5/335; H03F 3/16
[52] U.S. Cl. .................... 348/300; 348/311; 330/277; 250/214 A
[58] Field of Search ..................... 348/311, 300, 348/303, 308, 294; 250/214 A, 214 AG; 330/59, 308, 277; 359/191, 194, 195; 257/216, 237, 239; 327/514; 356/319; 377/60, 58; H04N 5/335

[56] References Cited

U.S. PATENT DOCUMENTS 4,412,744  11/1983  Lee et al. ........................ 356/319
4,574,249  3/1986   Williams ........................... 330/59
4,668,971  5/1987   Hynecek ........................... 257/239

*Primary Examiner*—Wendy Garber
*Assistant Examiner*—Andrew B. Christensen
*Attorney, Agent, or Firm*—Ray G. Wilson

[57] ABSTRACT

A low-noise FET amplifier is connected to amplify output charge from a charge coupled device (CCD). The FET has its gate connected to the CCD in common source configuration for receiving the output charge signal from the CCD and output an intermediate signal at a drain of the FET. An intermediate amplifier is connected to the drain of the FET for receiving the intermediate signal and outputting a low-noise signal functionally related to the output charge signal from the CCD. The amplifier is preferably connected as a virtual ground to the FET drain. The inherent shunt capacitance of the FET is selected to be at least equal to the sum of the remaining capacitances.

3 Claims, 9 Drawing Sheets

Frequency

ENHANCED PERFORMANCE CCD OUTPUT AMPLIFIER

BACKGROUND OF THE INVENTION

This invention relates to charge coupled devices (CCDs) and, more particularly, to a low noise configuration for amplifying CCD output charge. This invention was made with government support under Contract No. W-7405-ENG36 awarded by the U.S. Department of Energy. The government has certain rights in the invention.

CCDs form the core of modern electronic imaging. CCDs are used, e.g., in camcorders, the Hubble telescope, and in many other scientific applications, as a quantitative imager. For scientific applications, the emphasis is often on ultra-low noise to allow a few photons per pixel to be detected. Slow frame rates of 0.01 to 0.1 per second, with bandwidths of 5 to 200 kHz can be used to minimize noise. But the developing markets in engineering and process control require faster frame rates of 1 to 10 per second, accepting noise of 10 to 40 photons per pixel to provide the increased speed.

Instrument amplifier designs, such as CCD output circuits, often encounter a small voltage input across a high impedance, where the high impedance is usually caused by a small capacitance. For DC instruments an ultra-high input impedance may be the optimum noise amplifier to use, but this is not the case for high speed or broadband applications. Therefore, the common desire to use a high equivalent load impedance for maximum voltage transfer may not be valid where active devices, such as transistors and FETs, are used in the circuit design.

In general, a high input impedance for FET semiconductor devices is not optimum, but is often chosen. Such a prior art CCD amplifier circuit is shown schematically in FIG. 1. CCD 12 outputs a charge signal, i.e., a current, to FET 14 connected in source follower configuration. CCD 12 depicts only a CCD element up to its output node, with shunt capacitance $C_o$ at the output node. FET 14 has gain $g_m$ and shunt capacitance $C_{gs}$. An intermediate signal is output from FET 14 to amplifier 16 connected as a high impedance load to the source of FET 14. However, the noise resulting from the feedback resistance $R_f$ for the second stage amplifier 16 is often much larger than the intrinsic noise of FET 14 so that minimum overall noise at readout rates below about 20 Megapixels/sec would be achieved by retaining the FET in its highest current gain, or common source, configuration.

For FET devices the device transconductance gain $g_m$ is proportional to the input capacitance $C_{gs}$. At high frequencies, where $C_{gs}$ begins to dominate circuit impedance, the ratio $g_m/C_{gs}$ is a figure of merit $\eta$ for the device, such that $g_m = \eta C_{gs}$. To maintain a high input impedance, $C_{gs}$ must be kept to a small capacitance value. But gain $g_m$ is decreased at a given $\eta$ by reducing $C_{gs}$. Gain $g_m$ can be maintained by increasing drain current ($g_m \propto \sqrt{I_d}$), but this results in concomitant heating of the FET and increased shot noise in the FET.

An additional aspect of FET performance important to CCD amplifier improvements is noise: Johnson, or white, noise and pink, or flicker, noise. White noise can be reduced by reducing the operating bandwidth. But flicker noise has an amplitude spectral density that is inversely related to frequency so that flicker noise sets a "floor" level for noise reduction. In the case of MOS FET devices, it has been observed that flicker noise reduces in amplitude and corner frequency as the gate length (L) is increased. But FET gain-bandwidth is undesirably reduced by increasing L.

These CCD output noise problems are addressed by the present invention by alleviating the need for slow and low frequency operation. This CCD output amplifier design has improved output noise performance.

Accordingly, it is an object of the present invention to provide an overall FET/amplifier design for use with CCDs that reduces output noise while maintaining output bandwidth at high sample rates.

Another object of the present invention is to minimize the effect of flicker noise while providing an acceptable gain-bandwidth for the circuit.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise a low-noise output amplifier for amplifying output charge from a CCD. A FET has its gate connected to the CCD for receiving the output charge signal from the CCD and outputs an intermediate signal. An intermediate amplifier is connected to the drain of the FET for receiving the intermediate signal and outputting a low-noise signal functionally related to the output charge signal from the CCD. This configuration is known as a common source configuration for the FET.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 2:
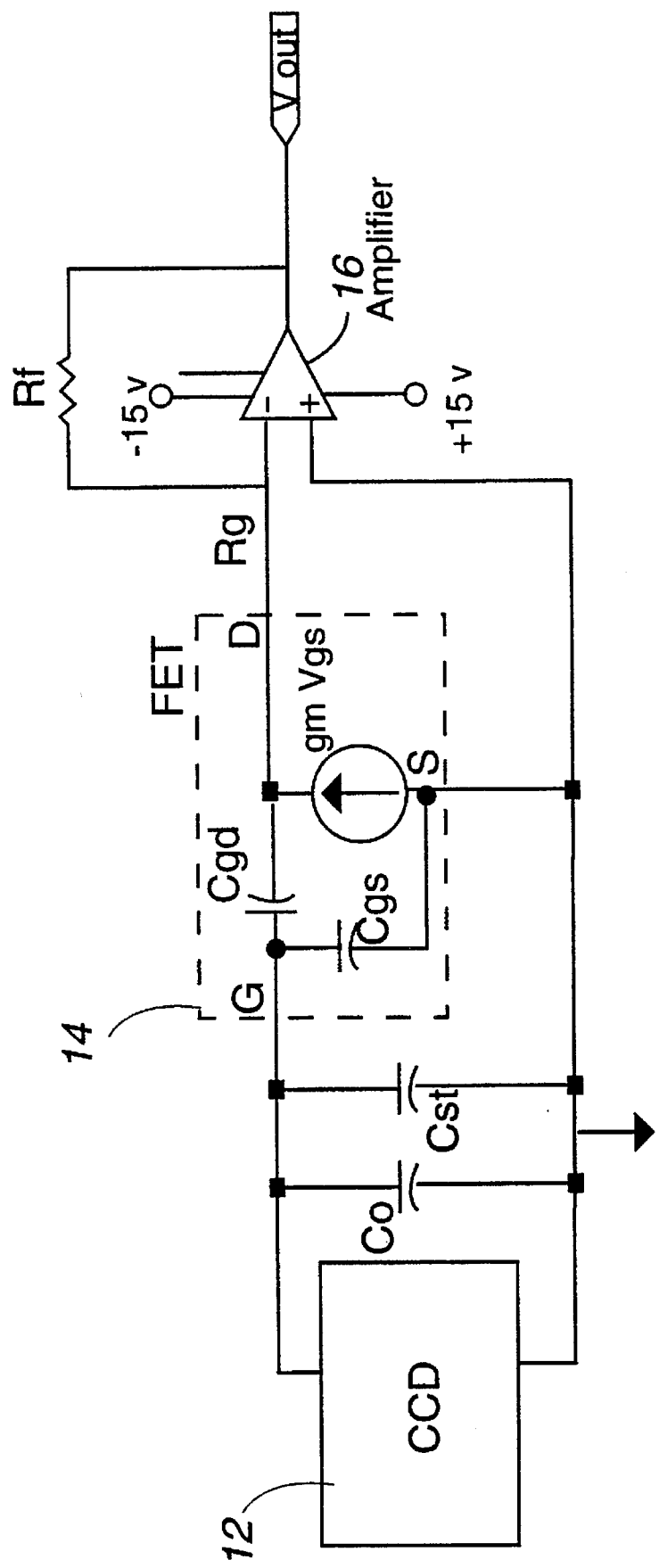
FIG. 2 is a schematic diagram of a CCD output circuit in accordance with one embodiment of the present invention.

FIG. 2 is a schematic diagram of a CCD amplifier circuit in accordance with one embodiment of the present invention. The output from CCD 12 is input to FET 14 having shunt capacitance $C_{gs}$ and transconductance gain $g_m$ and connected in a common source configuration. CCD 12 represents only a CCD device up to the CCD output node. FET 14 is preferably a JFET, but may be a monolithic MOS FET incorporated with CCD 12. Amplifier 16 is connected to FET 14 in a transimpedance or virtual ground configuration, where FET 14 and amplifier 16 form a complete amplification circuit for the charge output from CCD 12. By a transimpedance configuration is meant an amplifier whose input is a current and whose output is a voltage; i.e., a circuit that exhibits a very low input impedance and high output impedance. A virtual ground looks like a ground, i.e., a very low input impedance, over the operating bandwidth.

In accordance with the present invention, a low-noise amplifier circuit is obtained by providing FET 14 with a high front-end transconductance gain $g_m$ with amplifier 16 connected in a transimpedance configuration. Amplifier 16 then acts as a virtual ground second stage to provide current mode amplification rather than voltage amplification. The total gain for the circuit shown in FIG. 2 is $$G_V(\text{Volts/coulomb}) = \frac{R_f g_m}{C_o + C_{st} + C_{gs} + C_{gd}},$$

where $C_o$ is the CCD 12 shunt capacitance, $C_{st}$ is the circuit stray capacitance, $C_{gs}$ is the gate-source shunt capacitance, $C_{gd}$ is the gate-drain capacitance, $R_f$ is the feedback resistance for amplifier 16, and $g_m$ is the FET 14 gain. In accordance with the present invention, $g_m = \eta C_{gs}$ so that the circuit gain becomes $$G_V = \eta R_f \frac{C_{gs}}{C_o + C_{st} + C_{gs} + C_{gd}},$$

where all of the components are identified above. Note that $C_{gd}$ can have an effective value 5 to 10 times the physical value due to Miller feedback effect if voltage gain is used in the first stage. In this circuit, the second stage is a transimpedance stage with an intentionally low input impedance so that voltage gain is deferred and buffered and only the actual value of $C_{gd}$ is seen.

Thus, this circuit avoids the need to reduce $C_{gs}$ to maintain input impedance and maximize gain. Indeed, the gain goes to zero if $C_{gs}$ goes to zero. If $C_{gs}$ increases in value, $G_v$ increases in value until $C_{gs}$ becomes greater than the sum of the remaining capacitances and thereafter asymptotically approaches its limiting value, $\eta R_f$. An increase in $C_{gs}$ is obtained by increasing the width of FET 14, which increases not only $g_m$, but also the drain current $I_d$, with concomitant heating of FET 14. Thus, a minimum value for $C_{gs}$ is at least the sum $C_o+C_{st}+C_{gd}$ and there is no benefit in increasing $C_{gs}$ much beyond this value. It is desirable to maintain a large $g_m$, however, in order to minimize noise from $R_f$, whereby the overall noise at readout rates below 20 Megapixels/second is minimized.

Figure 3:
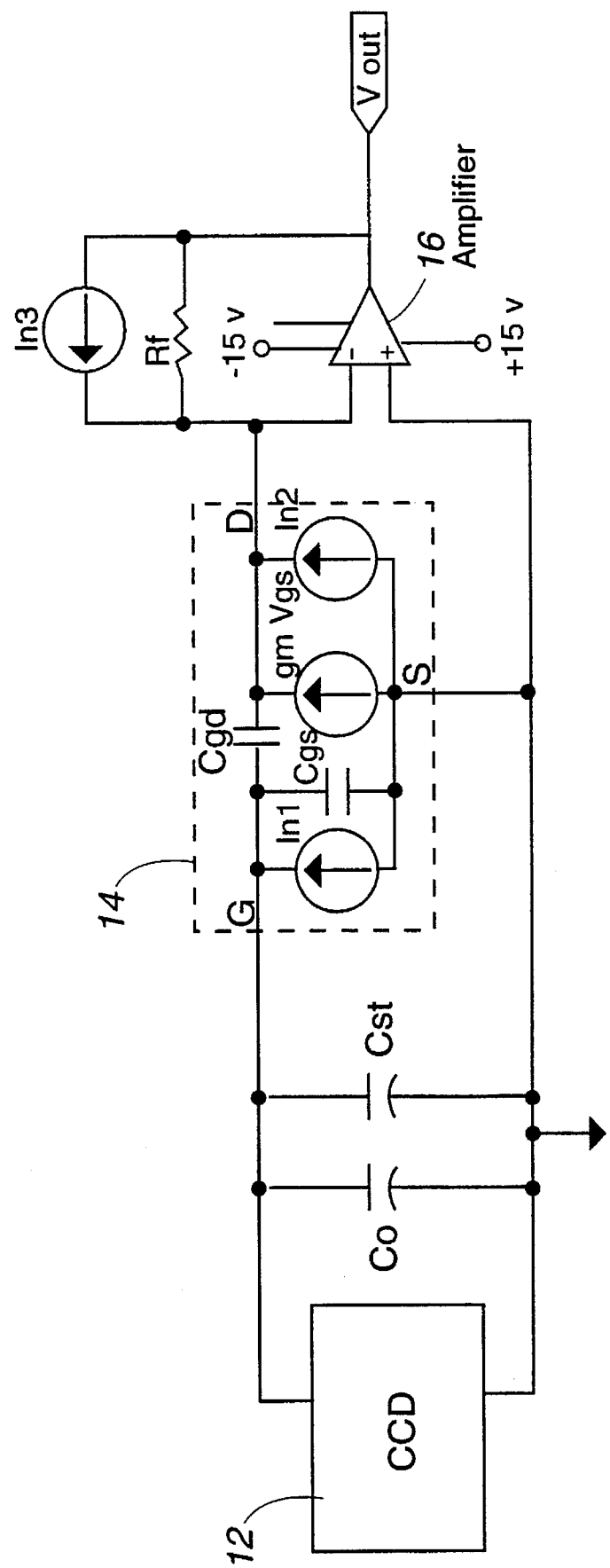
FIG. 3 is a schematic diagram of the CCD output circuit shown in FIG. 2 showing noise sources in the output circuit components.

FIG. 3 shows the noise sources important to operation of the CCD 12 output amplifier. Noise source In3 is the Johnson, or white, noise associated with feedback resistance $R_f$. Relevant noise sources for FET 14 are the white noise of the drain current (In2) and the white noise of the gate leakage current (In1). The noise source In2 can also be moved to the input circuit as a voltage noise source in series, reduced by the gain of FET 14.

Gate leakage current noise in FETs is often insignificant, but the present invention is directed to sensing CCD charge outputs as low as a single electron and any noise source can be important. Typical discrete MOS FET gate leakage currents $(I_l)$ are about 1 pA, resulting in noise $\delta_Q = \sqrt{I_l T_s}$, where $T_s$ is the CCD pixel sample rate. For $I_l=1$pA, $T_s$ must be less than 0.6 µsec for a gate leakage uncertainty of one electron. At a floor of 10 electrons, the sample time can be as long as 60 µsec. The other noise sources have opposite time dependencies, i.e., decrease as time increases, however, and 1 pA is not necessarily the upper limit of small FET leakage current. Another noise source, flicker noise, is reduced by increasing the FET gate length (L) to an optimum L that is determined by making the intrinsic device gain vs. frequency curve approximately correct for the desired operating bandwidth and frame rate of the CCD. Gate length L cannot be unduly increased, however, since the FET gain-bandwidth is inversely proportional to $L^2$. Small values of L are generally found in high frequency amplifier transistors.

The drain current $(I_D)$ noise is the dominant contributor to output amplifier performance. First, the change in $I_D$ due to the desired input signal charge is calculated by multiplying by the circuit gain:

$$\Delta I_D = \frac{\eta C_{gs} Q_{in}}{C_o + C_{st} + C_{gs} + C_{gd}} \approx \eta Q_{in},$$

where the approximation is valid for the present invention. As a general approximation for available FET devices, $\eta \leq 3$ mmho/pF. Then for a single electron per pixel, $\Delta I_D=0.5$ nA, while for 10 electrons $\Delta I_D=5$ nA. The noise of the output circuit is the RMS sum of In2 and In3:

$$\delta I_D = \sqrt{q I_D/T_s + 2kT/T_s R_f},$$

where the bandwidth relationship $B \approx 1/(2T_s)$ is used to replace conventional expressions for B. It is desirable for $\delta I_D/\Delta I_D \leq 1$. It can be seen that long sample times reduce both components of drain current noise, which is why slow scan cameras are designed for scientific uses. $R_f$ is made large enough to not be a significant contributor of noise, so that $\delta I_d$ must be made lower than 0.5 to 5 nA (i.e., for noise of 1 to 10 electrons). If a sample rate of 50 µsec is assumed as a useful upper limit due to flicker noise, then $I_D \leq 78$ µamps for 1 electron or 7.8 milliamps for 10 electrons per pixel. Available CCDs routinely achieve 3 to 5 electrons of noise with the circuit described in FIG. 1, indicating that $\eta$ is greater than the maximum value of 3 mmho/pF assumed above.

Figure 4:
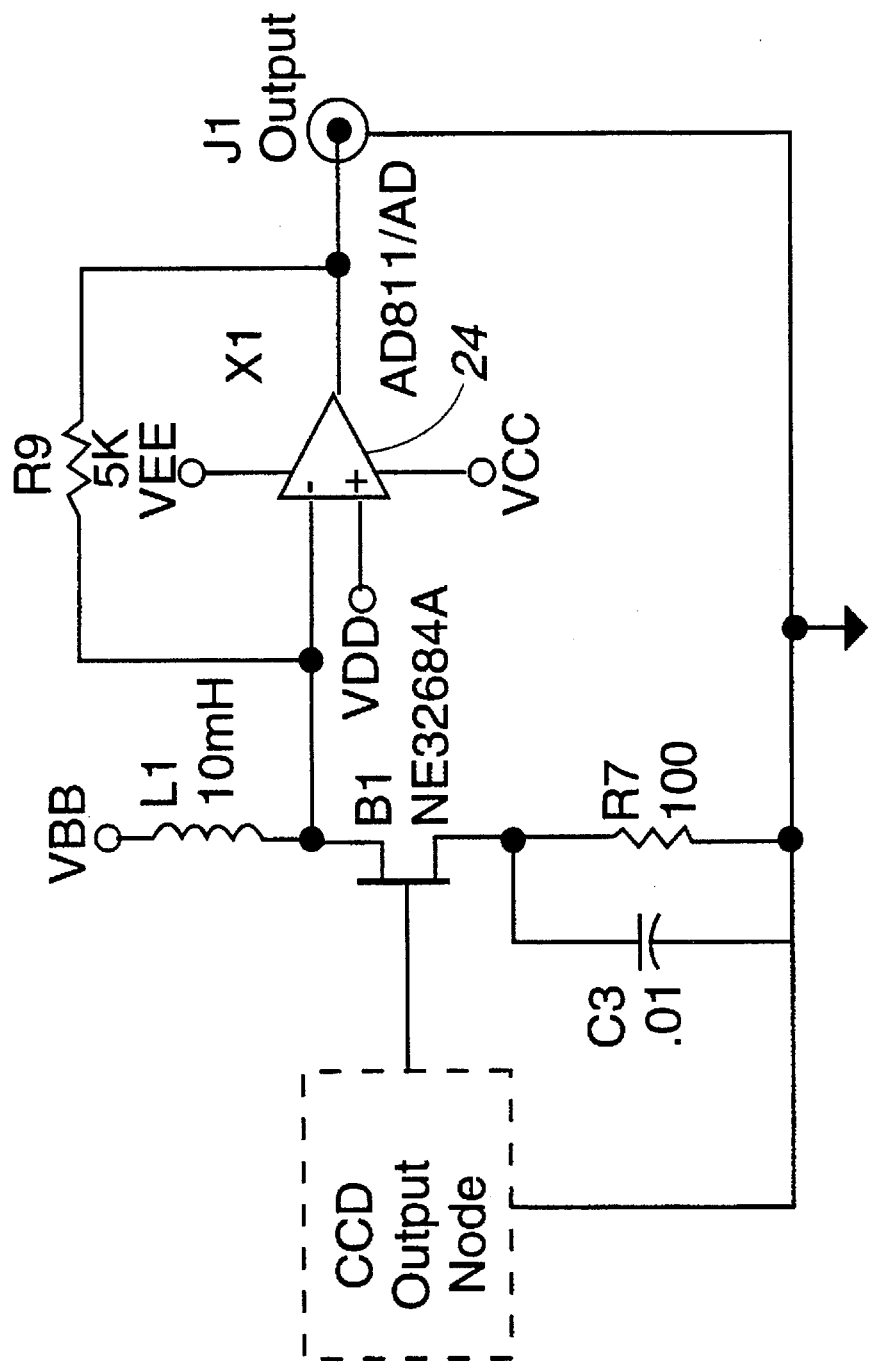
FIG. 4 is a circuit diagram for the circuit generally shown in FIG. 2.
Figure 5:
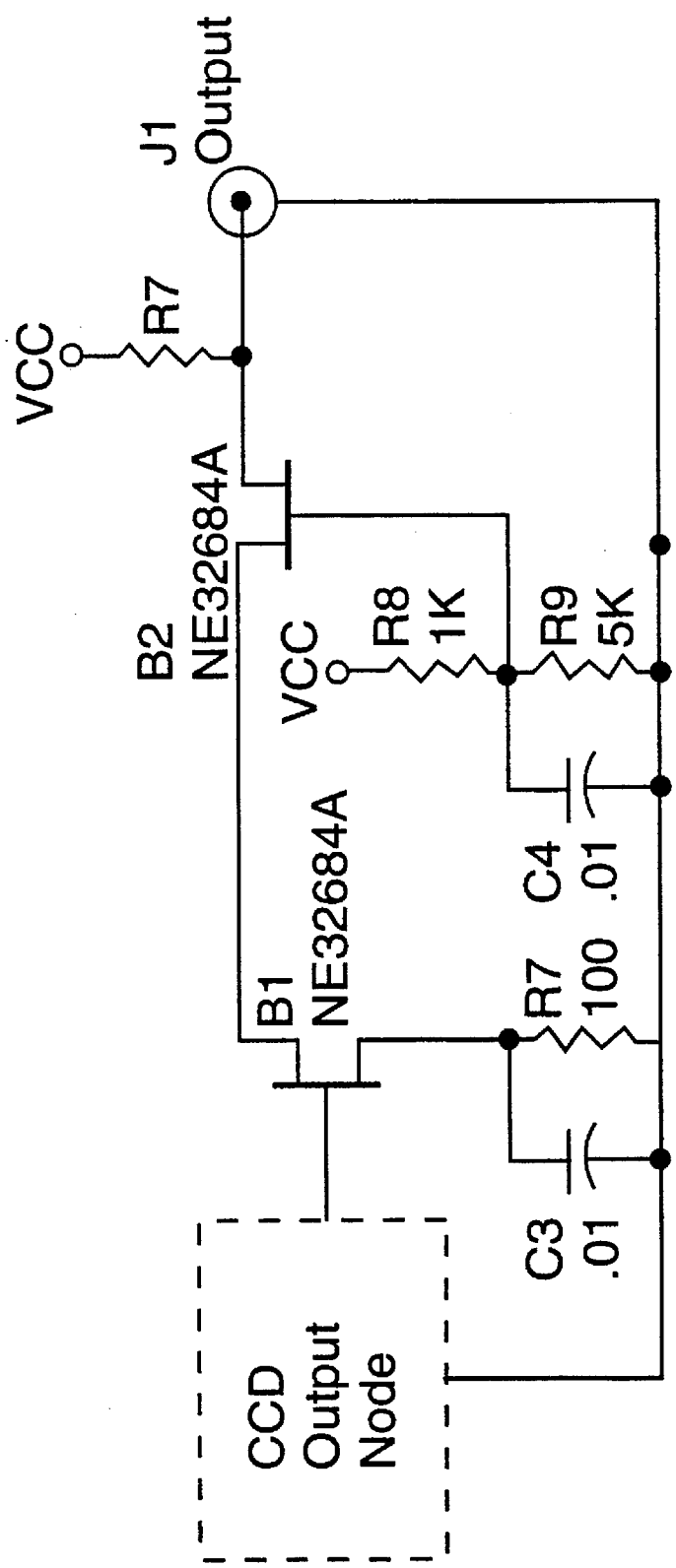
FIG. 5 is an alternate circuit diagram for the circuit shown in FIG. 2.

Referring now to FIG. 4, there is shown an exemplary circuit schematic with actual component values used to implement the circuit shown in FIG. 2 with an operational amplifier AD. FIG. 5 is an second exemplary circuit schematic with an FET B2 amplifier substituting for amplifier 16. FET B2 is connected as a common gate amplifier, which also provides a virtual ground at the input. The operational amplifier configuration of FIG. 4 may be used if the amplifier is mounted apart from the integrated circuit with FET B 1. The drain of FET B1 is connected to the inverting input of operational amplifier AD. The FET amplifier configuration of FIG. 5 is used when a common integrated circuit substrate is used to form all of the circuit components.

Figure 6A:
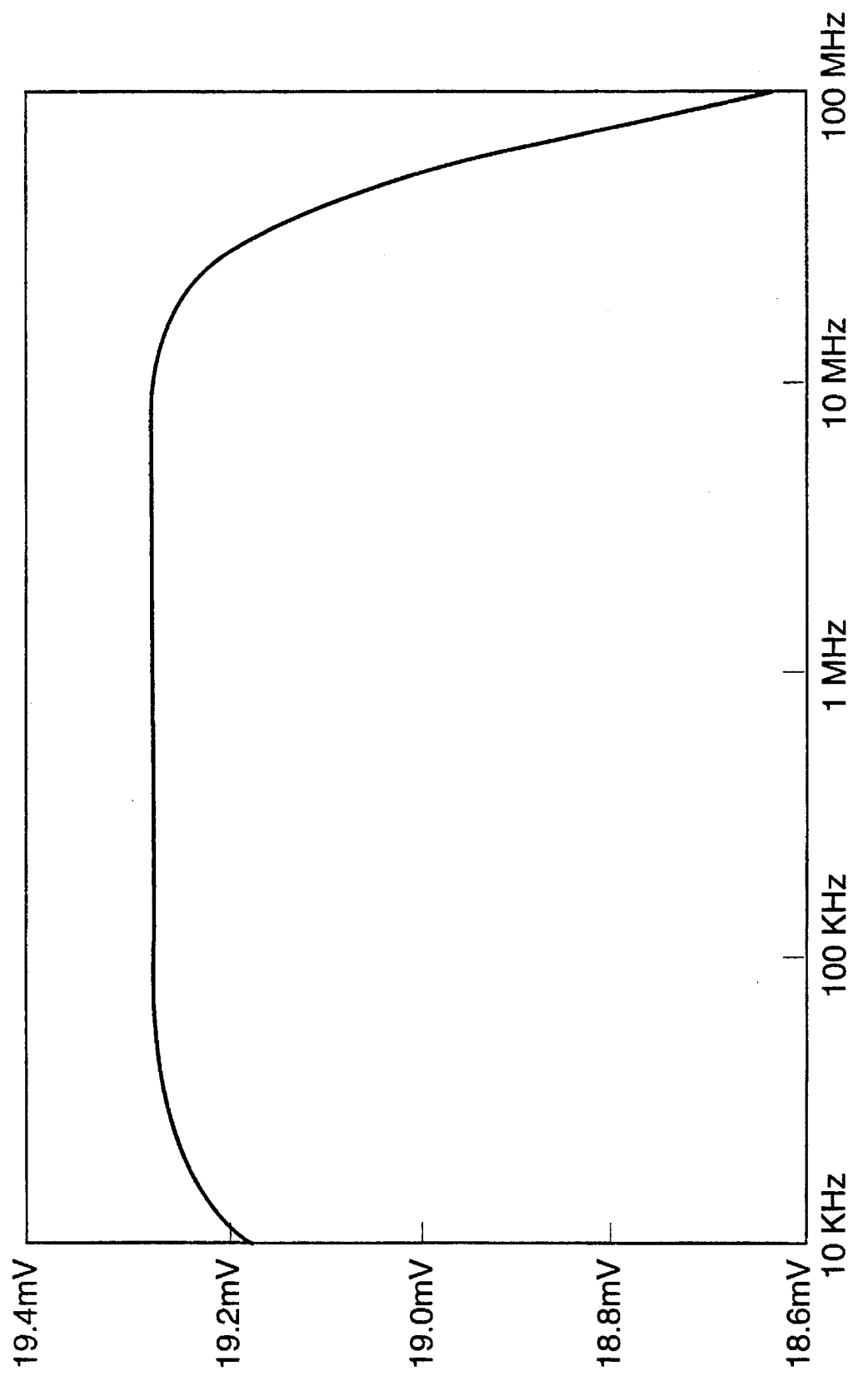
FIG. 6A graphically depicts the calculated frequency response of the circuit shown in FIG. 4.
Figure 6B:
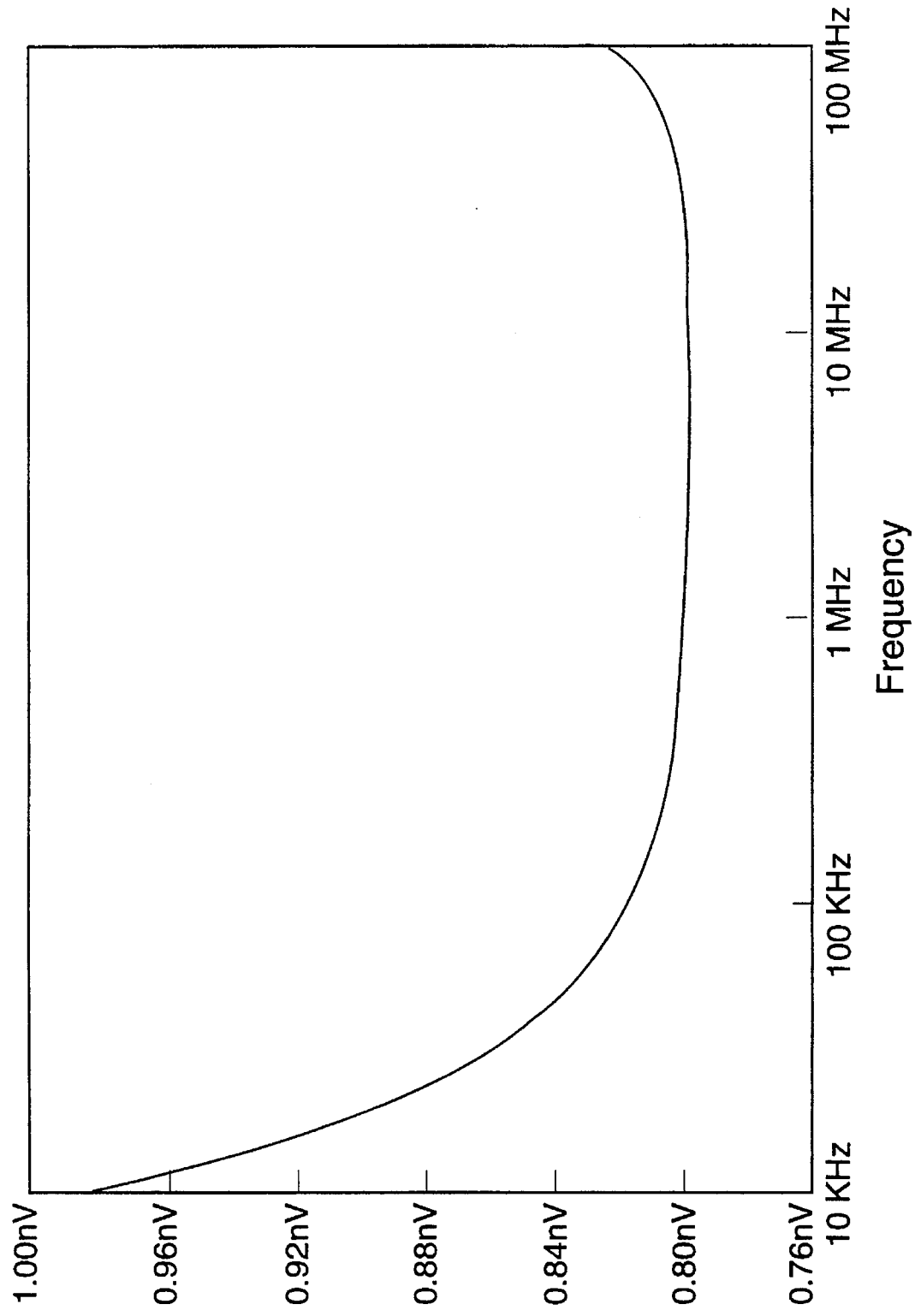
FIG. 6B graphically depicts the calculated output noise of the circuit shown in FIG. 4.
Figure 7A:
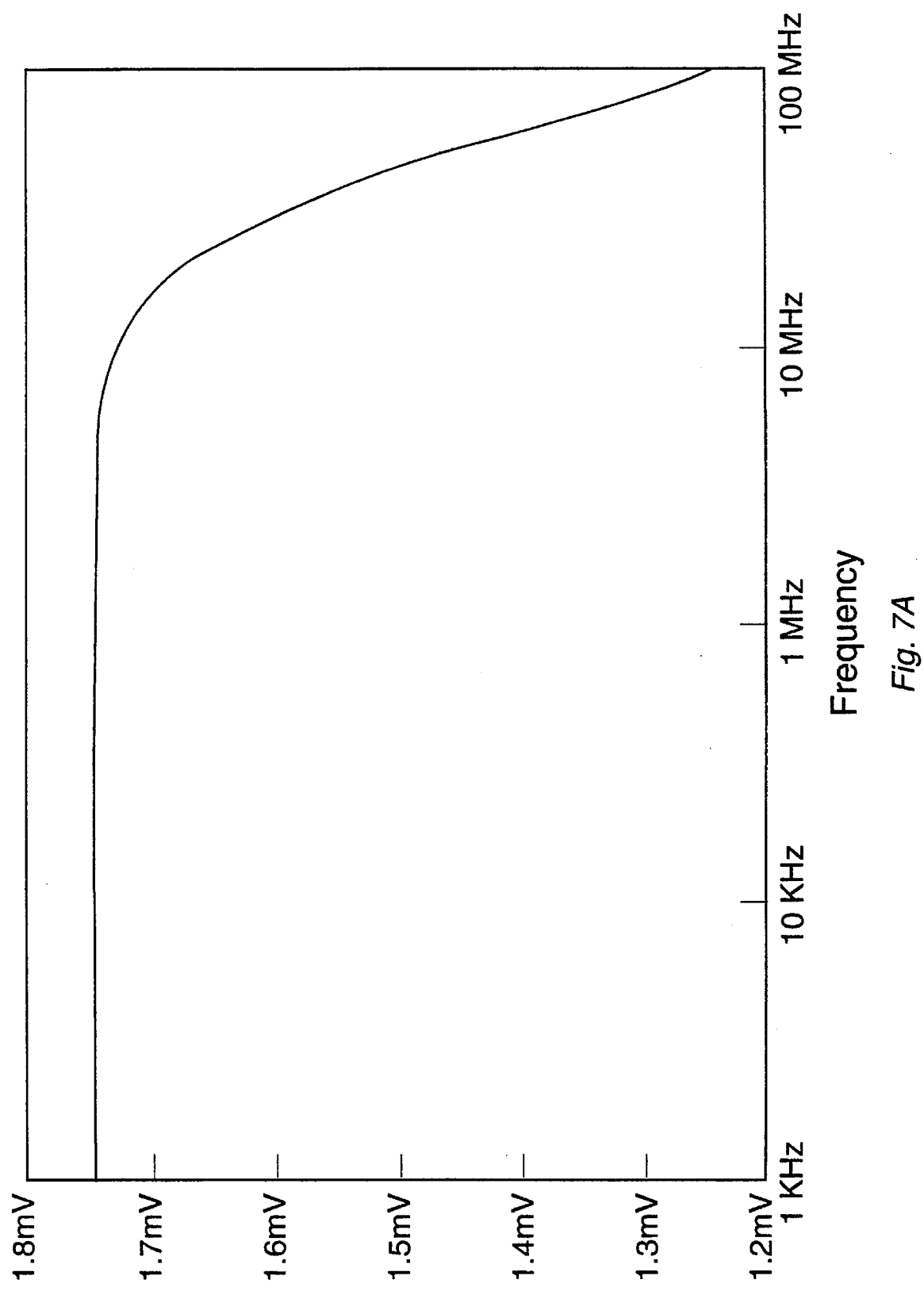
FIG. 7A graphically depicts the calculated frequency response of the circuit shown in FIG. 1.

The performance of the circuit shown in FIG. 4 was simulated using a commercial software SPICE 2G over the same frequency range from 10 kHz to 100 MHz for the frequency response (FIG. 6A) and the noise output referred to the input source (FIG. 6B). The performance of a conventional source follower CCD amplifier (see FIG. 1) was simulated also, with the frequency response shown in FIG. 7A and the noise output shown in FIG. 7B. A comparison of FIGS. 6A and 7A indicate that the bandwidth for the circuits is generally comparable, but the peak output amplitude is substantially greater for the circuit shown in FIG. 4 using the same standard input voltage.

Figure 1:
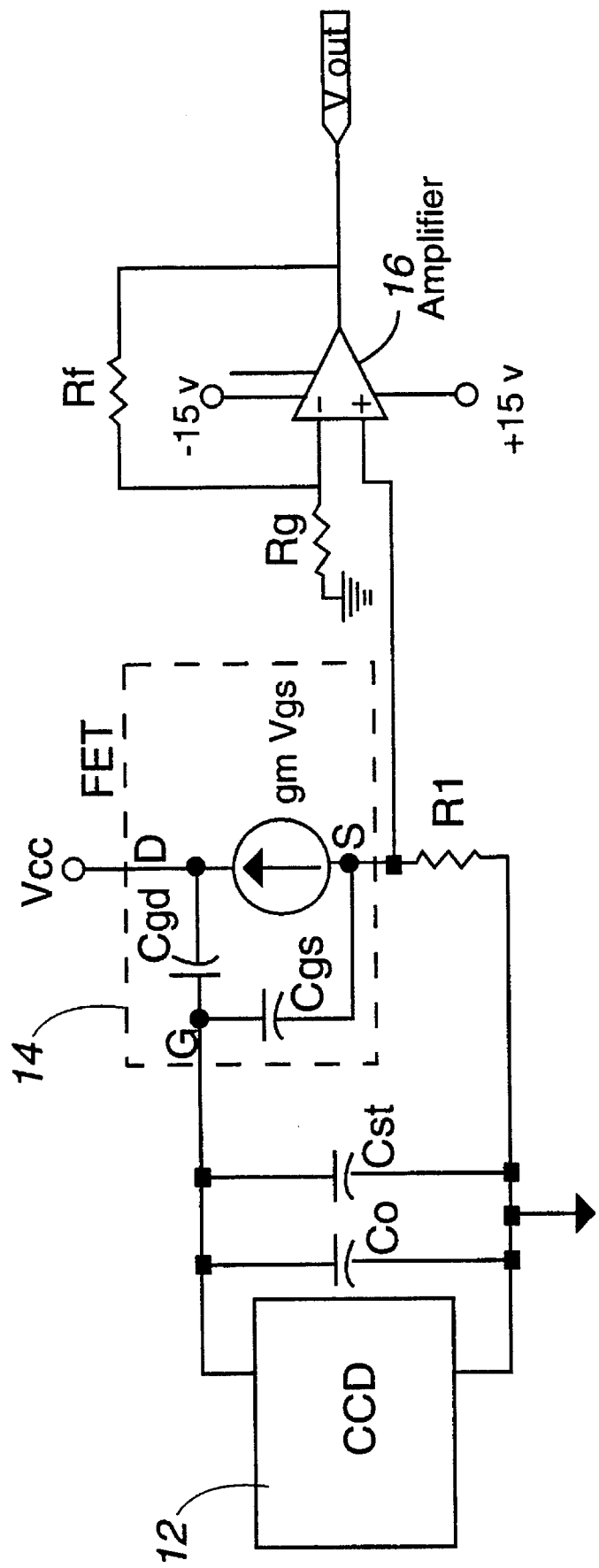
FIG. 1 is a schematic diagram of a prior art CCD output circuit.
Figure 7B:
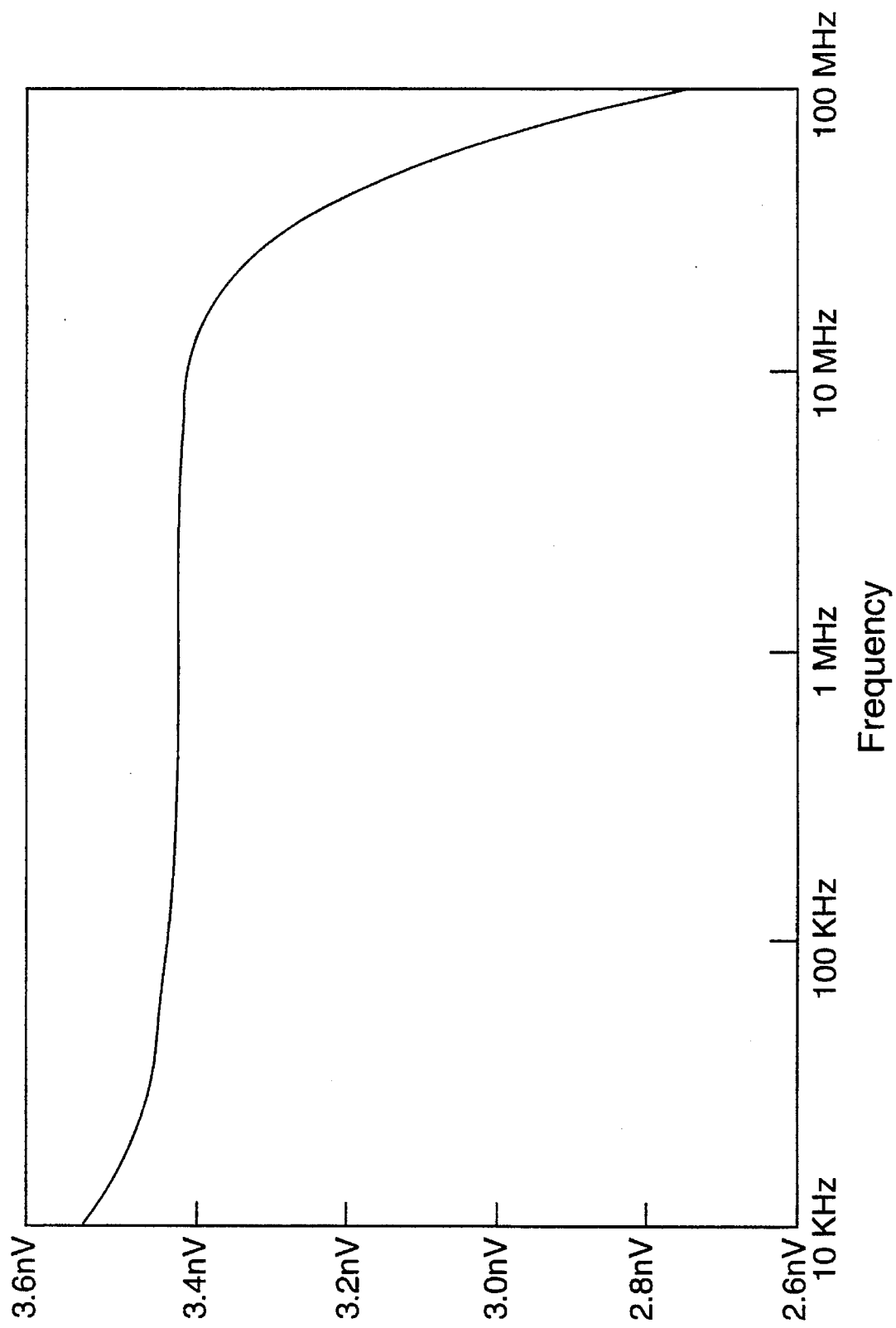
FIG. 7B graphically depicts the calculated output noise of the circuit shown in FIG. 1.

FIGS. 6B and 7B illustrate a substantial difference in noise performance between the low noise configuration (FIG. 4) and a conventional source follower configuration (FIG. 1). The CCD amplifier configuration according to the present invention has a noise output in the range of 0.80 nv over the operating bandwidth (100 KHz to 10 MHz) compared with a noise output of about 3.4 nv of the conventional circuit.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An output amplifier for amplifying an output charge signal from a CCD comprising:

A FET having a gate connected to said CCD for receiving said output charge signal from said CCD and outputting an intermediate signal from a drain of said FET where said FET has a gate-to-source shunt capacitance at least equal to the sum of CCD shunt capacitance, circuit stray capacitance, and gate-to-drain capacitance, the remaining capacitances seen at the output node of said CCD; and an intermediate amplifier connected to said drain of said FET for receiving said intermediate signal and outputting a low-noise signal.

2. An output amplifier according to claim 1, where said FET is formed on the same semiconductor substrate as the CCD.

3. An output amplifier according to claim 1, wherein said intermediate amplifier is connected as a virtual ground to said drain of said FET.

* * * * *